United States Patent
Dahmani et al.

(10) Patent No.: US 7,682,841 B2
(45) Date of Patent: Mar. 23, 2010

(54) METHOD OF FORMING INTEGRATED CIRCUIT HAVING A MAGNETIC TUNNEL JUNCTION DEVICE

(75) Inventors: Faiz Dahmani, Alfortville (FR); Gill Yong Lee, Boissise-le-Roi (FR)

(73) Assignees: Qimonda AG, Munich (DE); Altis Semiconductor, SNC., Corbeil Essonnes (FR)

( * ) Notice: Subject to any disclaimer, the term of this patent is extended or adjusted under 35 U.S.C. 154(b) by 462 days.

(21) Appl. No.: 11/743,497

(22) Filed: May 2, 2007

(65) Prior Publication Data

US 2008/0274567 A1 Nov. 6, 2008

(51) Int. Cl.
*H01L 21/00* (2006.01)
(52) U.S. Cl. .................... 438/3; 438/905; 257/E21.665
(58) Field of Classification Search .............. 438/3, 438/905; 257/E21.665
See application file for complete search history.

(56) References Cited

U.S. PATENT DOCUMENTS

| | | | |
|---|---|---|---|
| 6,469,926 B1 | 10/2002 | Chen | |
| 6,750,068 B2 | 6/2004 | Chen | |
| 6,754,100 B1 | 6/2004 | Hayakawa | |
| 7,102,923 B2 | 9/2006 | Hayawaka | |
| 7,110,284 B2 | 9/2006 | Hayawaka et al. | |
| 7,203,090 B2 | 4/2007 | Hayawaka | |
| 7,224,601 B2 | 5/2007 | Panchula | |
| 7,241,631 B2 | 7/2007 | Huai et al. | |
| 2003/0180968 A1* | 9/2003 | Nallan et al. | 438/3 |
| 2004/0105305 A1 | 6/2004 | Hayawaka | |
| 2004/0208053 A1 | 10/2004 | Hayawaka | |
| 2006/0256614 A1 | 11/2006 | Hayawaka | |
| 2007/0025029 A1 | 2/2007 | Hayawaka et al. | |
| 2007/0047294 A1 | 3/2007 | Panchula | |

* cited by examiner

*Primary Examiner*—Sue Purvis
*Assistant Examiner*—Monica D Harrison
(74) *Attorney, Agent, or Firm*—Dicke, Billig & Czaja, PLLC

(57) ABSTRACT

A method for manufacturing an integrated circuit having a magnetic tunnel junction device is disclosed. The method includes depositing a bottom pinning structure above the bottom conductive structure. A first ferromagnetic structure is deposited above the bottom pinning structure in a chamber. A tunnel barrier structure is deposited above the first ferromagnetic layer structure in the chamber, and a second ferromagnetic structure is deposited above the tunnel barrier structure of the magnetic tunnel junction device in another chamber.

48 Claims, 4 Drawing Sheets

METHOD OF FORMING INTEGRATED CIRCUIT HAVING A MAGNETIC TUNNEL JUNCTION DEVICE

BACKGROUND

Magnetic (or magneto-resistive) random access memory (MRAM) is a non-volatile memory technology that shows considerable promise for long-term data storage. Performing read and write operations on MRAM devices is much faster than performing read and write operations on conventional memory devices such as DRAM and Flash and order of magnitude faster than long-term storage device such as hard drives. In particular, future generation MRAM devices, such as "Spin Torque," "Thermal Select," "Thermally-Assisted Spin Torque," operate at low voltages, and have low power consumption. In MRAM devices, the information is no longer stored by electrical charges, as in semiconductor memories, but by two opposite directions of the magnetization vectors in a small magnetic structure.

Conventionally, the basic MRAM cell is the so-called magnetic tunnel junction (MTJ) which consists of multiple ferromagnetic layers sandwiching at least one non-magnetic layer. Information is stored as directions of magnetization vectors in the magnetic layers. The magnetization of one of the layers, acting as a reference layer, is fixed or pinned and kept rigid in one given direction. The other layer, acting as the storage layer is free to switch between the same and opposite directions that are called parallel and anti-parallel states, respectively. The corresponding logic state ("0" or "1") of the memory is hence defined by its resistance state (low or high).

The change in conductance for these two magnetic states is described as a magneto-resistance. Accordingly, a detection of change in resistance allows an MRAM device to provide information stored in the magnetic memory element. The difference between the maximum (anti-parallel; $R_{AP}$) and minimum (parallel; $R_P$) resistance values, divided by the minimum resistance is known as the tunneling magnetoresistance ratio (TMR) of the magnetic tunnel junction (MTJ) and is defined as $(R_{AP}-R_P)/R_P$. To achieve high density and small size for future generations of MRAM, it is also important to develop deposition tool configurations for the fabrication of magnetic tunnel junction (MTJ) devices characterized by high tunneling magnetoresistance ratios (e.g.: TMR>100%), very low resistance-area values (e.g.: RA<10 $\Omega$-$\mu m^2$) and high breakdown voltage (e.g.: $V_{BD}$~0.6 V) for current-induced magnetization switching (CIMS).

MTJ stacking elements (magnetic and non-magnetic layers), including the tunnel barrier layers, are conventionally fabricated using sputtering deposition systems, such as Physical Vapor deposition (PVD) systems or Ion Beam Deposition (IBD) systems without vacuum break. Physical Vapor deposition (PVD), as well Ion Beam Deposition (IBD), can deposit a wide variety of materials at very low pressure, providing, for example, layers with high crystallinity. Although Atomic Layer Deposition (ALD) does not have such a flexibility, it is capable of depositing very smooth and uniform materials layers, very special requirements needed for the tunnel barrier layer in MTJ devices. Effectively, the resistance-area (RA) product of an MTJ device is an exponential function of the thickness of the tunnel barrier layer. Any deviation in the thickness uniformity of such tunnel barrier layer will have a critical impact on the reliability and performance of the MTJ device.

Another aspect that can have a critical impact on the performance of an MTJ device is the transfer process of a substrate between two deposition chambers. The interfaces of the deposited thin films can be affected when the deposition of a next thin film layer is performed in another deposition chamber than the last deposited layer. Performing the deposition of the critical layers such as the tunnel barrier in the same chamber as the bottom and top layers interfacing directly with it is important in avoiding degradation of the corresponding interfaces, which can lead to high quality tunnel barrier needed for high performance MTJ devices.

For these and other reasons, there is a need for the present invention.

SUMMARY

In one embodiment, a method for manufacturing an integrated circuit comprising a magnetic tunnel junction device is described. The method includes performing a pre-clean etch process of a carrier of the magnetic tunnel junction device in a first chamber, depositing a bottom conductive layer structure above the carrier of the magnetic tunnel junction device in a second chamber, depositing a bottom pinning layer structure above the bottom conductive layer structure of the magnetic tunnel junction device in the second chamber, depositing a first ferromagnetic layer structure above the bottom pinning layer structure of the magnetic tunnel junction device in a third chamber, depositing a tunnel barrier layer structure above the first ferromagnetic layer structure of the magnetic tunnel junction device in the third chamber, depositing a second ferromagnetic layer structure above the tunnel barrier layer structure of the magnetic tunnel junction device in the third chamber, and depositing a top conducting layer structure above the second ferromagnetic layer structure of the of the magnetic tunnel junction device in the second chamber.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back,"

"leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
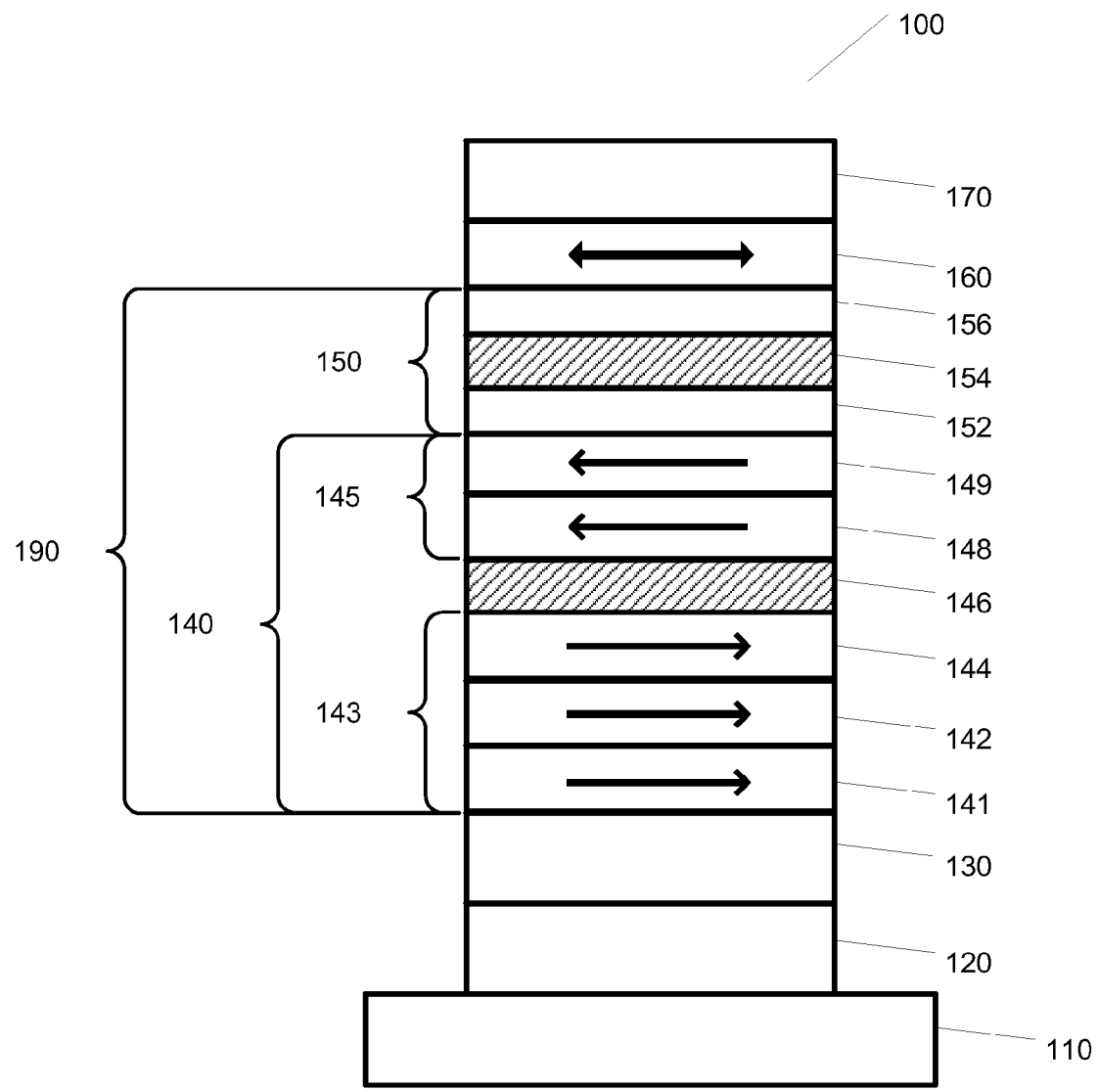
FIG. 1 is a cross-sectional view illustrating one embodiment of an integrated circuit having a magnetic tunnel junction according to one embodiment.

FIG. 1 is a cross-sectional view illustrating one embodiment of a an integrated circuit having magnetic tunnel junction. In one embodiment, the magnetic tunnel junction (MTJ) stack 100 includes a carrier 110 (e.g. a substrate), followed by the formation of a bottom conducting layer structure 120 (also referred to as "bottom lead layer") on or above the carrier 110. In one embodiment, the conducting bottom layer structure 120 may be a multilayer formation of a Tantalum Nitride (TaN) layer and a Tantalum (Ta) layer deposited by sputter processes according to the sequence TaN—Ta (Ta layer formed above or on the TaN layer). In one embodiment, the Tantalum Nitride (TaN) layer may have an approximate thickness of two to six nanometers, while the Tantalum (Ta) layer may have an approximate thickness of one to three nanometers, although these ranges should be considered approximations and reasonable variations, due for example to manufacturing, can and should be expected.

In one embodiment, a bottom pinning layer structure of antiferromagnetic material (AFM) 130 is formed on or above the bottom conducting layer structure 120. In one embodiment, the pinning layer structure of antiferromagnetic material 130 may be a Platinum Manganese (PtMn) layer. In one embodiment, the pinning layer structure of antiferromagnetic material 130 may be an Iridium Manganese (IrMn) layer.

In one embodiment, a first ferromagnetic layer structure 140, acting as a "reference layer," is formed on or above the bottom pinning layer structure of antiferromagnetic material 130. In one embodiment, an insulating layer structure 150, acting as "tunnel barrier" is formed on or above the first ferromagnetic layer structure 140. In one embodiment, a second ferromagnetic layer structure 160, acting as "storage or free layer," is formed on or above the tunnel barrier structure 150.

In one embodiment, the first ferromagnetic layer structure 140 is a multilayer formation comprising a third ferromagnetic layer structure 143 disposed on or above the bottom pinning layer structure 130 of antiferromagnetic material, an antiferromagnetic coupling layer structure 146 disposed on or above the third ferromagnetic layer structure 143, and a fourth ferromagnetic layer structure 145 disposed on or above the antiferromagnetic coupling layer structure 146.

In one embodiment, the third ferromagnetic layer structure 143 is a multilayer formation comprising a fifth ferromagnetic layer structure 141 disposed on or above the bottom pinning layer structure of antiferromagnetic material 130, a sixth ferromagnetic layer structure 142 disposed on or above the fifth ferromagnetic layer structure 141, and a seventh ferromagnetic layer structure 144 disposed on or above the sixth ferromagnetic layer structure 142.

In one embodiment, the fifth ferromagnetic layer structure 141, the sixth ferromagnetic layer structure 142 and the seventh ferromagnetic layer structure 144 are all pinned to the bottom pinning layer structure of the antiferromagnetic material 130, in that their magnetic moments are prevented from any rotation in the presence of an external applied magnetic field up to a certain strength value. In one embodiment, the fifth ferromagnetic layer structure 141, the sixth ferromagnetic layer structure 142 and the seventh ferromagnetic layer structure 144 are all anti-ferromagnetically exchanged coupled to the fourth ferromagnetic layer structure 145 through the antiferromagnetic coupling layer structure 146.

In one embodiment, the fifth ferromagnetic layer structure 141 is an amorphous magnetic layer comprising a Cobalt Iron Boron (CoFeB) layer. In one embodiment, the fifth ferromagnetic layer structure 141 of Cobalt Iron Boron (CoFeB) has an approximate atom percentage of Boron (B) of 2% to 30%. In one embodiment, the fifth ferromagnetic layer structure 141 of Cobalt Iron Boron (CoFeB) has an approximate atom percentage of Boron (B) of 15% to 30%. In one embodiment, the fifth ferromagnetic layer structure 141 of Cobalt Iron Boron (CoFeB) has an approximate atom percentage of Boron (B) of 25%. Such stoichiometry may be obtained either by direct deposition from a Cobalt Iron Boron (CoFeB) target with the corresponding composition or by co-sputtering from a Cobalt Iron (CoFe) and Cobalt Iron Boron (CoFeB) targets simultaneously.

In one embodiment, the fifth ferromagnetic layer structure 141 has an approximate thickness of 5 Angstroms (Å) to 15 Angstroms (Å). These ranges, however, should be considered approximations and reasonable variations, due for example to manufacturing, can and should be expected.

In one embodiment, the fifth ferromagnetic layer structure 141 can inhibit any Manganese (Mn) migration into the reference layer 140 and the tunnel barrier layer structure 150 when the MTJ device is annealed at 340° C. and above. In one embodiment, the fifth ferromagnetic layer structure 141 can prevent then any degradation of the MTJ device when subjected to thermal stressing.

In one embodiment, the sixth ferromagnetic layer structure 142 comprises at least two elements selected from the group of alloys Cobalt (Co), Iron (Fe), and Nickel (Ni). In one embodiment, the sixth ferromagnetic layer structure 142 has an approximate thickness of 1 Angstrom (Å) to 30 Angstroms (Å).

In one embodiment, the seventh ferromagnetic layer structure 144 is an amorphous magnetic layer comprising a Cobalt Iron Boron (CoFeB) layer. In one embodiment, the seventh ferromagnetic layer structure 144 of Cobalt Iron Boron (CoFeB) has an approximate atom percentage of Boron (B) of 2% to 20%. In one embodiment, the seventh ferromagnetic layer structure 144 of Cobalt Iron Boron (CoFeB) has an approximate atom percentage of Boron (B) of 8% to 13%. In one embodiment, the seventh ferromagnetic layer structure 144 of Cobalt Iron Boron (CoFeB) has an approximate atom percentage of Boron (B) of 13%. Such stoichiometry may be obtained either by direct deposition from a Cobalt Iron Boron (CoFeB) target with the corresponding composition or by co-sputtering from a Cobalt Iron (CoFe) and Cobalt Iron Boron (CoFeB) targets simultaneously.

In one embodiment, the seventh ferromagnetic layer structure 144 has an approximate thickness of 1 Angstrom (Å) to 30 Angstroms (Å). In one embodiment, the seventh ferromagnetic layer structure 144 has an approximate thickness of 3 Angstroms (Å). These ranges, however, should be considered approximations and reasonable variations, due for example to manufacturing, can and should be expected.

This method of fabricating the third ferromagnetic layer structure 143 enables high tunneling magnetoresistance ratios (e.g.: TMR>100%), very low resistance-area values (e.g.: RA<10 $\Omega$-$\mu m^2$), and high breakdown voltage (e.g.: $V_{BD} \geq 0.6$ V) for current-induced magnetization switching to be obtained.

In one embodiment, the antiferromagnetic coupling layer structure 146 comprises a Ruthenium (Ru) layer. In one embodiment, the antiferromagnetic coupling layer structure 146 has an approximate thickness of 8.1 Angstroms (Å) to 8.9 Angstroms (Å), although these ranges should be considered approximations and reasonable variations, due for example to manufacturing, can and should be expected.

In one embodiment, the fourth ferromagnetic layer structure 145 is a multilayer formation comprising an eighth ferromagnetic layer structure 148 disposed on or above the antiferromagnetic coupling layer structure 146, and an ninth ferromagnetic layer structure 149 disposed on or above the eighth ferromagnetic layer structure 148. In one embodiment, the eighth ferromagnetic layer structure 148 and the ninth ferromagnetic layer structure 149 are magnetized in parallel directions with respect to each other.

In one embodiment, the fifth ferromagnetic layer structure 141, the sixth ferromagnetic layer structure 142, and the seventh ferromagnetic layer structure 144 are all anti-ferromagnetically exchanged coupled to the eighth ferromagnetic layer structure 148 and to the ninth ferromagnetic layer structure 149 through the antiferromagnetic coupling layer structure 146.

In one embodiment, the eighth ferromagnetic layer structure 148 is an amorphous magnetic layer comprising a Cobalt Iron Boron (CoFeB) layer. In one embodiment, the eighth ferromagnetic layer structure 148 of Cobalt Iron Boron (CoFeB) has an approximate atom percentage of Boron (B) of 2% to 30%. In one embodiment, the eighth ferromagnetic layer structure 148 of Cobalt Iron Boron (CoFeB) has an approximate atom percentage of Boron (B) of 15% to 30%. In one embodiment, the eighth ferromagnetic layer structure 148 of Cobalt Iron Boron (CoFeB) has an approximate atom percentage of Boron (B) of 25%. Such stoichiometry may be obtained either by direct deposition from a Cobalt Iron Boron (CoFeB) target with the corresponding composition or by co-sputtering from a Cobalt Iron (CoFe) and Cobalt Iron Boron (CoFeB) targets simultaneously.

In one embodiment, the eighth ferromagnetic layer structure 148 has an approximate thickness of 1 Angstrom (Å) to 30 Angstroms (Å). These ranges, however, should be considered approximations and reasonable variations, due for example to manufacturing, can and should be expected.

In one embodiment, the ninth ferromagnetic layer structure 149 is an amorphous magnetic layer comprising a Cobalt Iron Boron (CoFeB) layer. In one embodiment, the ninth ferromagnetic layer structure 149 of Cobalt Iron Boron (CoFeB) has an approximate atom percentage of Boron (B) of 2% to 20%. In one embodiment, the ninth ferromagnetic layer structure 149 of Cobalt Iron Boron (CoFeB) has an approximate atom percentage of Boron (B) of 13%. Such stoichiometry may be obtained either by direct deposition from a Cobalt Iron Boron (CoFeB) target with the corresponding composition or by co-sputtering from a Cobalt Iron (CoFe) and Cobalt Iron Boron (CoFeB) targets simultaneously.

In one embodiment, the ninth ferromagnetic layer structure 149 has an approximate thickness of 1 Angstrom (Å) to 30 Angstroms (Å). In one embodiment, the ninth ferromagnetic layer structure 149 has an approximate thickness of 3 Angstroms (Å). These ranges, however, should be considered approximations and reasonable variations, due for example to manufacturing, can and should be expected.

This method of fabricating the fourth ferromagnetic layer structure 145 enables high tunneling magnetoresistance ratios (e.g.: TMR>100%), very low resistance-area values (e.g.: RA<10 Ω-μm$^2$), and high breakdown voltage (e.g.: $V_{BD} \geqq 0.6$ V) for current-induced magnetization switching to be obtained.

In one embodiment, the tunnel barrier layer structure 150, formed on or above the first ferromagnetic layer structure 140, is a multilayer formation comprising a first metallic layer 152, a central tunnel barrier layer 154 formed on or above the first metallic layer 152, and a second metallic layer 156 formed on or above central tunnel barrier layer 154. In one embodiment, the first metallic 152 layer of the tunnel barrier layer structure 150 is a Magnesium (Mg) layer. In one embodiment, the first metallic layer 152 of Magnesium (Mg) has an approximate thickness of 1 to 3.9 Angstroms (Å), although these ranges should be considered approximations and reasonable variations, due for example to manufacturing, can and should be expected. In one embodiment, the first metallic layer 152 of Magnesium (Mg) has an approximate thickness of 2 Angstroms (Å). In one embodiment, the central tunnel barrier layer 154 of the tunnel barrier layer structure 150 is a Magnesium Oxide (MgO) layer. In one embodiment, the central tunnel barrier layer 154 of Magnesium Oxide (MgO) is formed by RF-sputtering from a Magnesium Oxide (MgO) target. In one embodiment, the central tunnel barrier layer 154 of Magnesium Oxide (MgO) is formed by radical oxidation of a pre-sputtered metallic layer of Magnesium (e.g. reactively depositing additional metallic Magnesium in the presence of Oxygen, in-situ radical, natural or plasma oxidation). In one embodiment, the second metallic layer 156 of the tunnel barrier layer structure 150 is a Magnesium (Mg) layer. In one embodiment, the second metallic layer 156 of Magnesium (Mg) has an approximate thickness of 1 to 3.9 Angstroms (Å), although these ranges should be considered approximations and reasonable variations, due for example to manufacturing, can and should be expected. In one embodiment, the second metallic layer 156 of Magnesium (Mg) has an approximate thickness of 2 Angstroms (Å).

In one embodiment, the first metallic 152 layer of the tunnel barrier layer structure 150 is an Aluminium (Al) layer. In one embodiment, the first metallic layer 152 of Aluminium (Al) has an approximate thickness of 1 to 3.9 Angstroms (Å), although these ranges should be considered approximations and reasonable variations, due for example to manufacturing, can and should be expected. In one embodiment, the first metallic layer 152 of Aluminium (Al) has an approximate thickness of 2 Angstroms (Å). In one embodiment, the central tunnel barrier layer 154 of the tunnel barrier layer structure 150 is an Aluminium Oxide ($Al_2O_3$) layer. In one embodiment, the central tunnel barrier layer 154 of Aluminium Oxide ($Al_2O_3$) is formed by RF-sputtering from an Aluminium Oxide ($Al_2O_3$) target. In one embodiment, the central tunnel barrier layer 154 of Aluminium Oxide ($Al_2O_3$) is formed by radical oxidation of a pre-sputtered metallic layer of Aluminium (e.g. depositing an additional metallic Aluminium layer followed by in-situ radical, natural or plasma oxidation). In one embodiment, the second metallic layer 156 of the tunnel barrier layer structure 150 is an Aluminium (Al) layer. In one embodiment, the second metallic layer 156 of Aluminium (Al) has an approximate thickness of 1 to 3.9 Angstroms (Å), although these ranges should be considered approximations and reasonable variations, due for example to manufacturing, can and should be expected.

In one embodiment, the second metallic layer 156 of Aluminium (Al) has an approximate thickness of 2 Angstroms (Å). In other embodiments, this method of fabricating the tunnel barrier layer structure 150 may be extended to other materials than MgO or $Al_2O_3$. In one embodiment, the introduction of the first metallic layer 152 and the second metallic layer 156 in the tunnel barrier layer structure 150 and, in particular, the use of the same material for these two metallic layers improves the bottom and top interfaces of the central tunnel barrier layer 154 generating a high quality tunnel barrier layer structure 150. This method of fabricating the tunnel barrier layer structure 150 enables high tunneling magnetoresistance ratios (e.g.: TMR>100%), very low resistance-area values (e.g.: RA<10 Ω-μm$^2$), and high breakdown voltage (e.g.: $V_{BD} \geq 0.6$ V) for current-induced magnetization switching to be obtained.

In one embodiment, the second ferromagnetic layer structure 160 (also referred to as "free layer") formed on or above the tunnel barrier layer structure 150 may comprise at least two components of alloys of Cobalt (Co), Iron (Fe), and Nickel (Ni). In one embodiment, the second ferromagnetic layer structure 160 may be made amorphous by doping the alloys with Boron (B). In one embodiment, the second ferromagnetic layer structure 160 acting as a storage layer, is not pinned and is free to rotate in the presence of a sufficient applied magnetic field.

In one embodiment, the first ferromagnetic layer structure 140 together with the tunnel barrier layer structure 150 and the second ferromagnetic layer structure 160 form a spin transfer torque magnetization reversal layer structure 190. In one embodiment, during a write operation, a vertical current applied to the device and passing through the spin transfer torque magnetization reversal layer structure 190 (i.e. through the second ferromagnetic layer structure 160, the tunnel barrier layer structure 150 and the first ferromagnetic layer structure 140) gets spins polarized and causes a torque on the magnetic polarization of the second ferromagnetic layer structure 160. In one embodiment, this torque is large enough to induce a complete reversal of the magnetization of the second ferromagnetic layer structure 160 such that the second ferromagnetic layer structure 160 functions as a storage layer to store the information.

In one embodiment, a top conductive layer structure 170 is formed on or above the second ferromagnetic layer structure 160. In one embodiment, the top conducting layer structure 170 may be a multilayer formation of a Tantalum (Ta) layer and a Tantalum Nitride (TaN) layer formed on or above the Tantalum (Ta) layer. In one embodiment, the Tantalum (Ta) layer may have an approximate thickness of 2 to 10 nanometers, while the Tantalum Nitride (TaN) layer may have an approximate thickness of 5 to 10 nanometers, although these ranges should be considered approximations and reasonable variations, due for example to manufacturing, can and should be expected.

Figure 2:
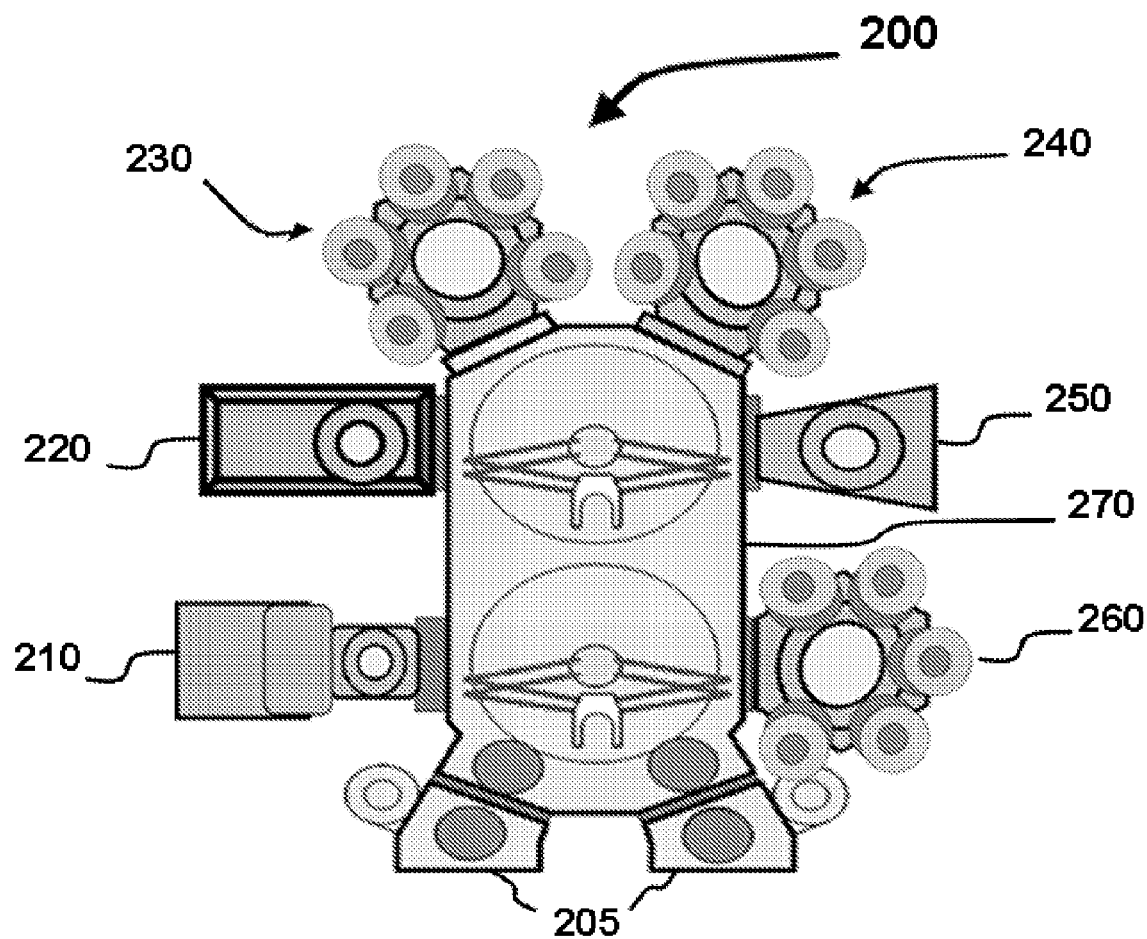
FIG. 2 is a schematic diagram illustrating one embodiment of a cluster-system for depositing magnetic and non-magnetic films.

FIG. 2 illustrates a cluster-system 200 for depositing magnetic and non-magnetic films according to one embodiment. Cluster-system 200 includes a plurality of load lock chambers, for example the two load lock chambers 205 in FIG. 2 (in one embodiment the loadlock chambers may have a vacuum pressure lower than 10$^{-6}$ Torr); a transfer vacuum chamber 270, which, in one embodiment, may have a vacuum pressure lower than 5×10$^{-10}$ Torr; a pre-clean etch vacuum chamber 210; an Ion Beam Deposition (IBD) vacuum chamber 220, multi-cathode (e.g. at least a two DC-cathodes vacuum chamber) vacuum chambers 230 and 260; at least a two-cathode vacuum chamber 240 having at least one radio frequency (RF) cathode for Magnesium Oxide (MgO) or Aluminum Oxide (Al$_2$O$_3$) deposition; and an atomic layer deposition (ALD) chamber 250.

Figure 3:
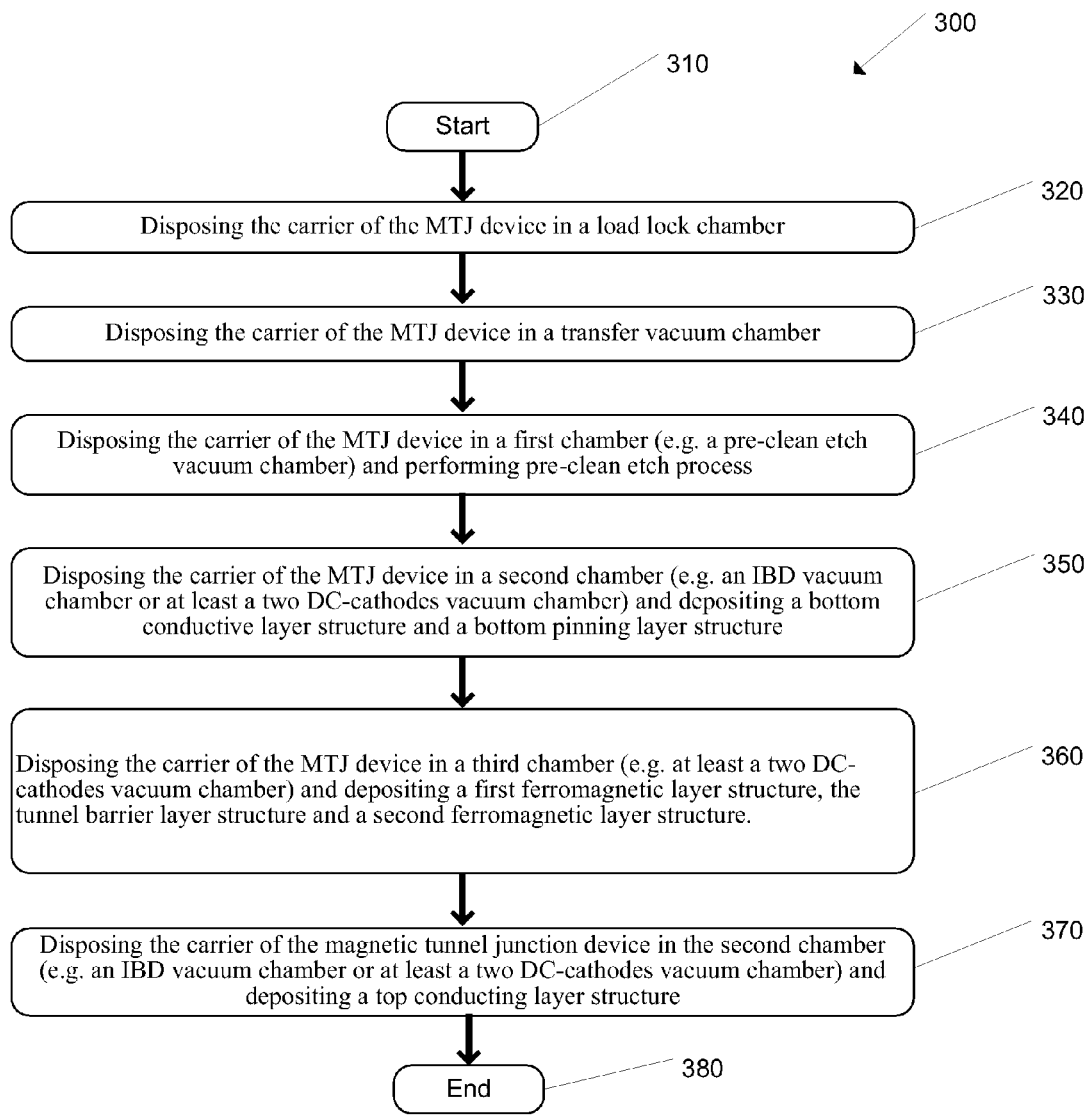
FIG. 3 is a flow diagram illustrating a method for forming an integrated circuit having a magnetic tunnel junction device according to one embodiment.

FIG. 3 is a flow diagram illustrating one embodiment of a process 300 for forming magnetic tunnel junction device 100. Process 300 begins at 310. At 320, process includes 300 the carrier 110 of magnetic tunnel junction device 100 in a load lock chamber, such as a load lock chamber 205. In one embodiment, load lock chamber 205 has a vacuum pressure lower than 10$^{-6}$ Torr. At 330 process 300 includes disposing the carrier 110 of magnetic tunnel junction device 100 in a transfer vacuum chamber, such as transfer vacuum chamber 270. In one embodiment, transfer vacuum chamber 270 has a vacuum pressure lower than 5×10$^{-10}$ Torr.

At 340, process 300 includes disposing the carrier 110 of the magnetic tunnel junction device 100 in a first chamber (e.g. a pre-clean etch vacuum chamber 210) and performing a pre-clean etch process of the carrier 110 of the magnetic tunnel junction device 100 in this first chamber. At 350 process 300 includes disposing the carrier 110 of the magnetic tunnel junction device 100 in a second chamber (e.g. an Ion Deposition Beam vacuum chamber 220 or at least a two DC-cathodes vacuum chamber 230 or 260), depositing the bottom conductive layer structure 120 on or above the carrier 110 of the magnetic tunnel junction device 100, and depositing a bottom pinning layer structure 130 on or above the bottom conductive layer structure 120 of the magnetic tunnel junction device 100 in this second chamber. At 360, process 300 includes disposing the carrier 110 of magnetic tunnel junction device 100 in a third chamber (e.g. at least a two-cathode vacuum chamber 240 having at least one RF cathode for Magnesium Oxide or Aluminum Oxide deposition), depositing a first ferromagnetic layer structure 140 on or above the bottom pinning layer structure 130 of the magnetic tunnel junction device 100, depositing a tunnel barrier layer structure 150 on or above the first ferromagnetic layer structure 140 of the magnetic tunnel junction device 100, and depositing a second ferromagnetic layer structure 160 on or above the tunnel barrier layer structure 150 of the of the magnetic tunnel junction device 100 in this third chamber. At 370 process 300 includes disposing the carrier 110 of the magnetic tunnel junction device 100 in the second chamber (e.g. an Ion Beam Deposition vacuum chamber 220 or at least a two DC-cathodes vacuum chamber 230 or 260), and depositing a top conducting layer structure 170 on or above the second ferromagnetic layer structure 160 of the of the magnetic tunnel junction device 100 in this second chamber. Process 300 ends at 380.

Figure 4:
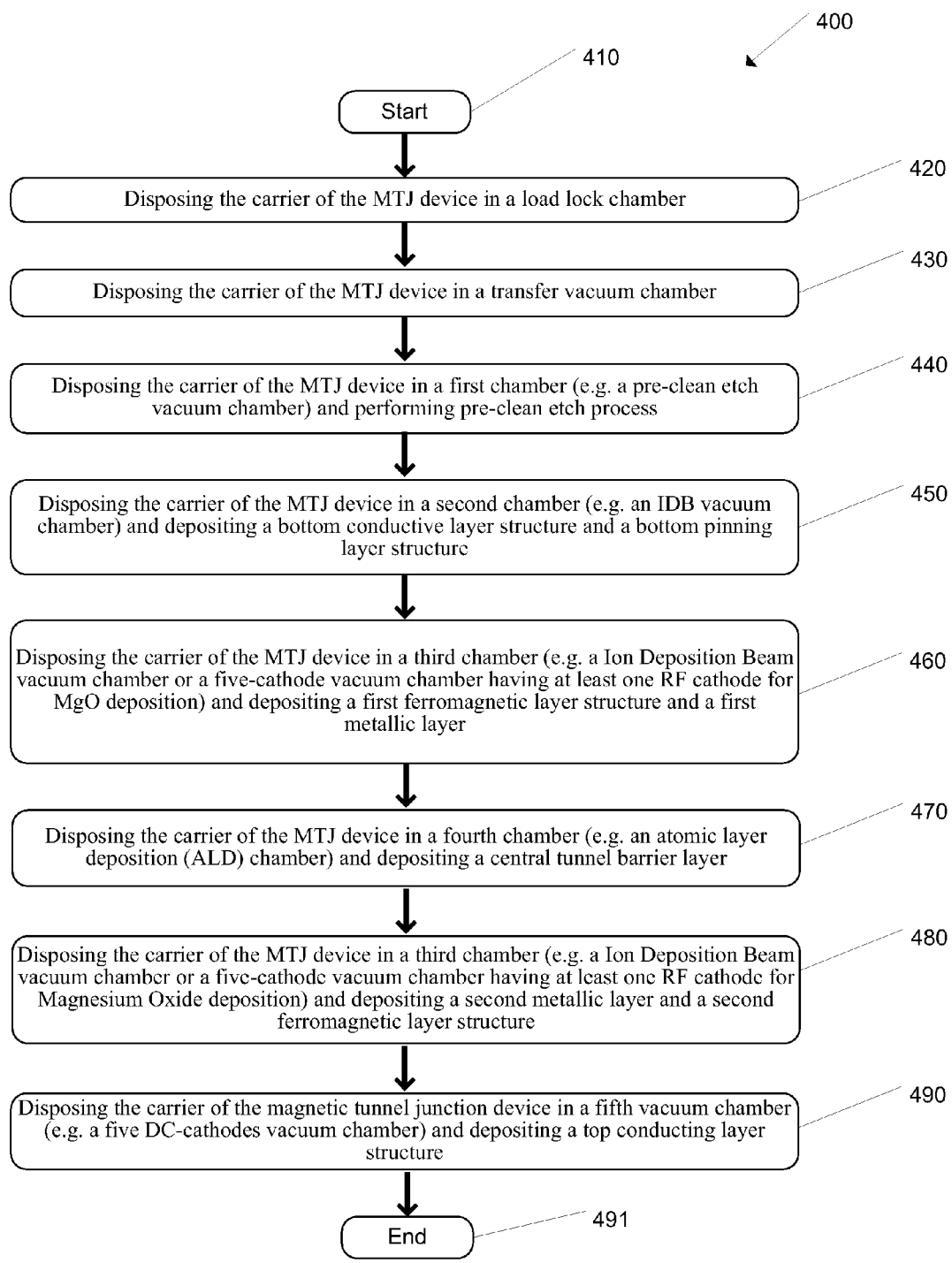
FIG. 4 is a flow diagram illustrating a method for forming an integrated circuit having a magnetic tunnel junction device according to one embodiment.

FIG. 4 is a flow diagram illustrating one embodiment of a process 400 for manufacturing the magnetic tunnel junction device 100. At 420 process 400 includes disposing the carrier 110 of the magnetic tunnel junction device 100 in a load lock chamber, such as load lock chamber 205. In one embodiment, the load lock chamber 205 has a vacuum pressure lower than 10$^{-6}$ Torr. At 430, process 400 includes disposing the carrier 110 of the magnetic tunnel junction device 100 in a transfer vacuum chamber, such as transfer vacuum chamber 270. In one embodiment, the transfer vacuum chamber 270 has a vacuum pressure lower than 5×10$^{-10}$ Torr.

At 440, process 400 includes disposing the carrier 110 of the magnetic tunnel junction device 100 in a first chamber (e.g. a pre-clean etch vacuum chamber 210) and performing a pre-clean etch process of the carrier 110 of the magnetic tunnel junction device 100 in this first chamber. At 450 process 400 includes disposing the carrier 110 of the magnetic tunnel junction device 100 in a second chamber (e.g. an Ion Beam Deposition vacuum chamber 220), depositing the bottom conductive layer structure 120 on or above the carrier 110 of the magnetic tunnel junction device 100, and depositing a bottom pinning layer structure 130 on or above the bottom conductive layer structure 120 of the magnetic tunnel junction device 100 in this second chamber.

At 460, process 400 includes disposing the carrier 110 of the magnetic tunnel junction device 100 in a third chamber (e.g. a Ion Beam Deposition vacuum chamber 220 or at least a two-cathode vacuum chamber 240 having at least one RF cathode for Magnesium Oxide or Aluminum Oxide deposition), depositing a first ferromagnetic layer structure 140 on or above the bottom pinning layer structure 130 of the magnetic tunnel junction device 100, and depositing a first metallic layer 152 on or above the first ferromagnetic layer structure 140 of the magnetic tunnel junction device 100 in this third chamber.

At 470, process 400 includes disposing the carrier 110 of the magnetic tunnel junction device 100 in a fourth chamber (e.g. an atomic layer deposition (ALD) chamber 250) and depositing a central tunnel barrier layer 154 on or above the a first metallic layer 152 of the magnetic tunnel junction device 100 in this fourth chamber.

At 480, process 400 includes disposing the carrier 110 of the magnetic tunnel junction device 100 in the third chamber (e.g. a Ion Deposition Beam vacuum chamber 220 or at least a two-cathode vacuum chamber 240 having at least one RF cathode for Magnesium Oxide or Aluminum Oxide deposition) and depositing a second metallic layer 156 on or above the central tunnel barrier layer 154 and a second ferromagnetic layer structure 160 on or above the second metallic layer 156 of the magnetic tunnel junction device 100 in this third chamber.

At 490, process 400 includes disposing the carrier 110 of the magnetic tunnel junction device 100 in a fifth chamber (e.g. at least a two DC-cathodes vacuum chamber 230 or 260) and depositing a top conducting layer structure 170 on or above the second ferromagnetic layer structure 160 of the of the magnetic tunnel junction device 100 in this fifth chamber. Process 400 ends at 491.

It should be understood that the above described processes for manufacturing a magnetic tunnel junction device are not limited to the magnetic tunnel junction device 100 illustrated in FIG. 1, but can be extended to other magnetic tunnel devices without departing from the spirit and scope as defined by the appended claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing an integrated circuit having a magnetic tunnel junction device, the method comprising:
    performing a pre-clean etch process of a carrier in a first chamber;
    depositing a bottom conductive layer structure above the carrier in a second chamber;
    depositing a bottom pinning layer structure above the bottom conductive layer structure in the second chamber;
    depositing a first ferromagnetic layer structure above the bottom pinning layer structure in a third chamber;
    depositing a tunnel barrier layer structure above the first ferromagnetic layer structure in the third chamber;
    depositing a second ferromagnetic layer structure above the tunnel barrier layer structure in the third chamber; and
    depositing a top conducting layer structure above the second ferromagnetic layer structure in the second chamber.

2. The method of claim 1, wherein the first chamber comprises a pre-clean etch vacuum chamber.

3. The method of claim 1, wherein the second chamber comprises an Ion Beam Deposition (IBD) vacuum chamber.

4. The method of claim 1, wherein the second chamber comprises a multi-cathode vacuum chamber.

5. The method of claim 4, wherein the multi-cathode vacuum chamber comprises at least a two direct current (DC)-cathodes vacuum chamber.

6. The method of claim 1, wherein the third chamber comprises at least a two-cathode vacuum chamber having at least one radio frequency (RF) cathode for Magnesium Oxide (MgO) or Aluminum Oxide ($Al_2O_3$) deposition.

7. The method of claim 1, including disposing the carrier in a loadlock chamber, wherein the loadlock chamber has a vacuum pressure lower than $10^{-6}$ Torr.

8. The method of claim 1, including disposing the carrier in a transfer vacuum chamber, wherein the transfer vacuum chamber has a vacuum pressure lower than $5\times10^{-10}$ Torr.

9. The method of claim 1, wherein the bottom conductive layer structure comprises:
    a Tantalum Nitride (TaN) layer; and
    a Tantalum (Ta) layer disposed above the Tantalum Nitride (TaN) layer.

10. The method of claim 9, wherein the Tantalum Nitride (TaN) layer has an approximate thickness of 2 to 6 nanometers, and wherein the Tantalum (Ta) layer has an approximate thickness of 1 to 3 nanometers.

11. The method of claim 1, wherein the bottom pinning layer structure comprises a layer selected from the group of layers consisting of a Platinum Manganese (PtMn) layer and an Iridium Manganese (IrMn) layer.

12. The method of claim 1, wherein the first and second ferromagnetic layer structures each comprise at least two elements selected from the group of alloys of Cobalt (Co), Iron (Fe), and Nickel (Ni).

13. The method of claim 12, wherein the alloys are doped with Boron (B).

14. The magnetic tunnel junction device of claim 1, wherein the first ferromagnetic layer structure is pinned to the bottom pinning layer structure of antiferromagnetic material.

15. The method of claim 1, wherein the tunnel barrier layer structure comprises a material selected from the group of materials consisting of Magnesium Oxide (MgO) and Aluminium Oxide ($Al_2O_3$).

16. The method of claim 1, wherein the top conductive layer structure comprises:
    a Tantalum (Ta) layer; and
    a Tantalum Nitride (TaN) layer formed above the Tantalum (Ta) layer, wherein the Tantalum (Ta) layer has an approximate thickness of 2 to 10 nanometers, and wherein the Tantalum Nitride (TaN) layer has an approximate thickness of 5 to 10 nanometers.

17. The method of claim 1, wherein the first ferromagnetic layer structure comprises:
    a third ferromagnetic layer structure disposed above the bottom pinning layer structure of antiferromagnetic material;
    an antiferromagnetic coupling layer structure disposed above the third ferromagnetic layer structure; and
    a fourth ferromagnetic layer structure disposed above the coupling layer structure.

18. The method of claim 17, wherein the third ferromagnetic layer structure is pinned to the bottom pinning layer structure of antiferromagnetic material.

19. The method of claim 17, wherein the third ferromagnetic layer structure and the fourth ferromagnetic layer structure are magnetized in antiparallel directions with respect to each other through the antiferromagnetic coupling layer structure.

20. The method of claim 17, wherein the third and fourth ferromagnetic layer structures each comprise at least two elements selected from the group of alloys of Cobalt (Co), Iron (Fe), and Nickel (Ni).

21. The method of claim 20, wherein the alloys are doped with Boron (B).

22. The method of claim 17, wherein the antiferromagnetic coupling layer structure comprises a Ruthenium (Ru) layer.

23. The method of claim 17, wherein the antiferromagnetic coupling layer structure has an approximate thickness of 8.1 Angstroms (Å) to 8.9 Angstroms (Å).

24. The method of claim 17, wherein the third ferromagnetic layer structure comprises:
   a fifth ferromagnetic layer structure disposed above the bottom pinning layer structure of antiferromagnetic material;
   a sixth ferromagnetic layer structure disposed above the fifth ferromagnetic layer structure; and
   a seventh ferromagnetic layer structure disposed above the sixth ferromagnetic layer structure.

25. The method of claim 24, wherein the fifth ferromagnetic layer structure, the sixth ferromagnetic layer structure, and the seventh ferromagnetic layer structure are pinned to the bottom pinning layer structure of antiferromagnetic material.

26. The method of claim 24, wherein the fifth ferromagnetic layer structure and the sixth ferromagnetic layer structure are both anti-ferromagnetically exchanged coupled to the fourth ferromagnetic layer structure through the antiferromagnetic coupling layer structure.

27. The method of claim 24, wherein the fifth ferromagnetic layer structure comprises a Cobalt Iron Boron (CoFeB) layer.

28. The method of claim 27, wherein the fifth ferromagnetic layer structure of Cobalt Iron Boron (CoFeB) has an approximate atom percentage of Boron (B) of 15% to 30%.

29. The method of claim 27, wherein the fifth ferromagnetic layer structure has an approximate thickness of 5 Angstrom (Å) to 15 Angstroms (Å).

30. The method of claim 24, wherein the sixth ferromagnetic layer structure comprises at least two elements selected from the group of alloys Cobalt (Co), Iron (Fe), and Nickel (Ni).

31. The method of claim 24, wherein the sixth ferromagnetic layer structure has an approximate thickness of 1 Angstrom (Å) to 30 Angstroms (Å).

32. The method of claim 24, wherein the seventh ferromagnetic layer structure comprises a Cobalt Iron Boron (CoFeB) layer.

33. The method of claim 32, wherein the seventh ferromagnetic layer structure of Cobalt Iron Boron (CoFeB) has an approximate atom percentage of Boron (B) of 2% to 20%.

34. The method of claim 24, wherein the seventh ferromagnetic layer structure has an approximate thickness of 1 Angstrom (Å) to 30 Angstroms (Å).

35. The method claim 17, wherein the fourth ferromagnetic layer structure comprises:
   an eighth ferromagnetic layer structure disposed above the antiferromagnetic coupling layer structure; and
   a ninth ferromagnetic layer structure disposed above seventh ferromagnetic layer structure.

36. The method of claim 35, wherein the eighth ferromagnetic layer structure and the ninth ferromagnetic layer structure are magnetized in parallel directions with respect to each other.

37. The method of claim 35, wherein the eighth ferromagnetic layer structure comprises an amorphous magnetic layer comprising a Cobalt Iron Boron (CoFeB) layer.

38. The method of claim 37, wherein the eighth ferromagnetic layer structure of Cobalt Iron Boron (CoFeB) has an approximate atom percentage of Boron (B) of 2% to 30%.

39. The method of claim 35, wherein the eighth ferromagnetic layer structure has an approximate thickness of 1 Angstrom (Å) to 30 Angstroms (Å).

40. The method of claim 35, wherein the ninth ferromagnetic layer structure comprises an amorphous magnetic layer comprising a Cobalt Iron Boron (CoFeB) layer.

41. The method of claim 35, wherein the ninth ferromagnetic layer structure of Cobalt Iron Boron (CoFeB) has an approximate atom percentage of Boron (B) of 2% to 20%.

42. The method of claim 35, wherein the ninth ferromagnetic layer structure has an approximate thickness of 1 Angstrom (Å) to 30 Angstroms (Å).

43. The method of claim 17, wherein the third ferromagnetic layer structure comprises:
   a fifth ferromagnetic layer structure disposed above the bottom pinning layer structure of antiferromagnetic material;
   a sixth ferromagnetic layer structure disposed above the ninth ferromagnetic layer structure; and
   a seventh ferromagnetic layer structure disposed above the fifth ferromagnetic layer structure.

44. The method of claim 43, wherein the fifth ferromagnetic layer structure, the sixth ferromagnetic layer structure, and the seventh ferromagnetic layer structure are all pinned to the bottom pinning layer structure of antiferromagnetic material.

45. The method of claim 43, wherein the fifth ferromagnetic layer structure, the sixth ferromagnetic layer structure, and the seventh ferromagnetic layer structure are all antiferromagnetically exchanged coupled to the fourth ferromagnetic layer structure through the antiferromagnetic coupling layer structure.

46. The method of claim 43, wherein the fifth ferromagnetic layer structure comprises an amorphous magnetic layer comprising a Cobalt Iron Boron (CoFeB) layer.

47. The method of claim 46, wherein the fifth ferromagnetic layer structure of Cobalt Iron Boron (CoFeB) has an approximate atom percentage of Boron (B) of 2% to 30%.

48. The method of claim 46, wherein the fifth ferromagnetic layer structure has an approximate thickness of 5 Angstroms (Å) to 15 Angstroms (Å).

* * * * *